(12) United States Patent
Pallotta (10) Patent No.: US 10,587,222 B2
(45) Date of Patent: Mar. 10, 2020

(54) METHOD OF OPERATING PHOTOVOLTAIC GENERATORS, CORRESPONDING CIRCUIT, DEVICE AND SYSTEM

(71) Applicant: STMICROELECTRONICS S.R.L., Agrate Brianza (IT)

(72) Inventor: Andrea Pallotta, Rho (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 184 days.

(21) Appl. No.: 15/921,427

(22) Filed: Mar. 14, 2018

(65) Prior Publication Data

US 2018/0278207 A1    Sep. 27, 2018

(30) Foreign Application Priority Data

Mar. 23, 2017    (IT) .................... 102017000032303

(51) Int. Cl.
| | | |
|---|---|---|
| *H02S 50/10* | (2014.01) | |
| *G01R 19/165* | (2006.01) | |
| *H02J 3/38* | (2006.01) | |
| *H02J 1/00* | (2006.01) | |
| *H02J 13/00* | (2006.01) | |

(52) U.S. Cl.
CPC ........ *H02S 50/10* (2014.12); *G01R 19/16519* (2013.01); *G01R 19/16528* (2013.01); *H02J 1/00* (2013.01); *H02J 3/385* (2013.01); *H02J 13/0003* (2013.01)

(58) Field of Classification Search
CPC .......... H02J 1/00; H02J 13/0003; H02J 3/385; G01R 19/16528; G01R 19/16519; H02S 50/10

See application file for complete search history.

(56) References Cited

U.S. PATENT DOCUMENTS

| | | | |
|---|---|---|---|
| 2008/0150366 A1* | 6/2008 | Adest | H02M 3/1582 307/77 |
| 2009/0206666 A1 | 8/2009 | Sella et al. | |
| 2012/0242320 A1 | 9/2012 | Fischer et al. | |

(Continued)

FOREIGN PATENT DOCUMENTS

| | | |
|---|---|---|
| EP | 2 477 318 A2 | 7/2012 |
| WO | 2013/177360 A1 | 11/2013 |

OTHER PUBLICATIONS

Guerriero et al., "Monitoring and Diagnostics of PV Plants by a Wireless Self-Powered Sensor for Individual Panels," *IEEE Journal of Photovoltaics* 6(1):286-294, 2016.

*Primary Examiner* — Jared Fureman
*Assistant Examiner* — Duc M Pham
(74) *Attorney, Agent, or Firm* — Seed Intellectual Property Law Group LLP (57) ABSTRACT

A photovoltaic power generation plant includes a plurality of photovoltaic generators cooperative in producing photovoltaic power. Coupled with the photovoltaic generators in the plurality of photovoltaic generators are respective sensor devices, the sensor devices including sensor circuits of the individual current-to-voltage characteristics of the photovoltaic generators. The sensor circuits in the sensor devices can be activated to sense the individual current-to-voltage characteristics of the photovoltaic generators, with the individual current-to-voltage characteristic being indicative of the functionality of each photovoltaic generator.

20 Claims, 3 Drawing Sheets

(56) References Cited

U.S. PATENT DOCUMENTS

| | | | |
|---|---|---|---|
| 2013/0026842 A1* | 1/2013 | Arditi | H02J 1/10 |
| | | | 307/82 |
| 2015/0137850 A1* | 5/2015 | Falk | G01R 31/025 |
| | | | 324/764.01 |
| 2016/0011246 A1 | 1/2016 | Fischer et al. | |
| 2018/0034410 A1* | 2/2018 | Hishikawa | H02S 50/10 |
| 2018/0358797 A1* | 12/2018 | Chaintreuil | G01R 19/16528 |

\* cited by examiner

METHOD OF OPERATING PHOTOVOLTAIC GENERATORS, CORRESPONDING CIRCUIT, DEVICE AND SYSTEM

BACKGROUND

Technical Field

The description relates to photovoltaic (PV) generators. One or more embodiments may be applied for instance in power plants (installations) including photovoltaic panels.

Description of the Related Art

In a now conventional arrangement, a PhotoVoltaic (PV) power plant includes a number of interoperating elements, that is PV panels or modules, which may be arranged in series to form a string of interconnected elements.

Reduced performance of even only one PV panel—as due to, e.g., shadow, dirt or damage—may lower the electrical energy produced by the entire string.

With a (very) large number of PV modules in the plant, keeping the whole system under control and ensuring effective maintenance may not be an easy task. A specialized monitoring sensor able to promptly identify malfunctioning conditions of each single PV panel appears useful and desirable.

Various solutions have been proposed to contribute in meeting such a demand.

For instance, so-called micro-inverters have been proposed to be connected to each PV panel in a plant with the function of converting the solar generated (DC) current power into an alternating current (AC) to be fed to the mains electrical supply grid, such micro-inverters being notionally capable of (e.g., continuously) tracking a peak (maximum) power point MPPT of the associated individual module (panel).

So-called "optimizers" have also been proposed. An optimizer may include a DC/DC converter which, once connected to a respective PV module, may increase the energy output from by constantly tuning the output to ameliorate performance of the inverter. An optimizer may continuously track a peak (maximum) power point MPPT of the associated individual module.

Both these kind of devices enable individual PV panel disconnection from the string and remote performance monitoring.

These devices may exhibit disadvantages such as being overly complex and expensive, prone to failure, and hardly suited for cheap retrofit on existing installations.

BRIEF SUMMARY

One or more embodiments may relate to a corresponding circuit, a corresponding device and a corresponding system (e.g., a photovoltaic power plant or installation).

One or more embodiments may permit to evaluate electrical parameters of an individual PV panel in a string, including operating string current and voltage (Io, Vo), short circuit current (Isc) and open circuit voltage (Voc) and, significantly, the maximum generated power Pmax, in just one measurement session, while also possibly taking into account PV panel operating temperature and ambient temperature measurement.

One or more embodiments may offer one or more of the following advantages:

transparent real-time measurement process without affecting PV string performance;

physical disconnection of individual PV module from the string avoided;

real-time full test of the main parameters of an individual PV panel, including operating V and I;

real-time checking the inverter power tracking functionality in terms of peak values $V_{MPPT}$ and $I_{MPPT}$ for;

monitoring of the PV panel $V_{oc}$ and $I_{sc}$ and I-V characteristic curve;

monitoring of ambient temperature;

fault and anomaly detection in each individual PV module electrical power generation;

powerful on board microcontroller unit for data analysis and correlation;

automatic PV module bypass in case of power loss due, e.g., to shadows, dirt or damage;

possible on-demand PV module disconnection to comply with fire-fighting standard rules;

optional sensor interfaces (for instance, standard USB) available for optionally measuring sun irradiance level, or wind speed;

wireless networking for full remote control and monitoring;

integration within a PV module "junction box" or connection to already installed PV modules easily feasible;

capability of working with a wide variety of inverters.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. More-over, particular conformations, structures, or characteristics may be combined in any adequate way in one or more embodiments.

The references used herein are provided merely for convenience and hence do not define the extent of protection or the scope of the embodiments.

Figure 1:
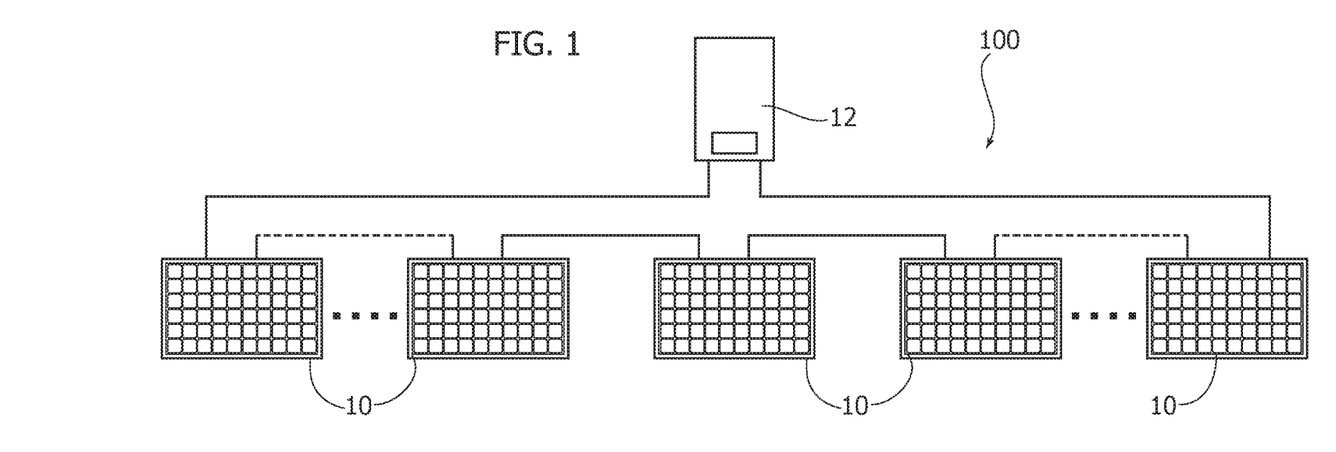
FIG. 1 is exemplary of a general layout of a system including a plurality of photovoltaic modules.

FIG. 1 is exemplary of a general layout of a PhotoVoltaic (PV) power plant including a plurality of interoperating photovoltaic generators 10, namely PV panels or modules. Such elements may be arranged (for instance connected in series) to form a string coupled to a control device 12 such as an inverter.

The arrangement of FIG. 1 is per se conventional, which makes it unnecessary to provide a more detailed description herein.

P. Guerriero et al.: "Monitoring and Diagnostics of PV Plants by a Wireless Self-Powered Sensor for Individual Panels", IEEE JOURNAL OF PHOTOVOLTAICS, VOL. 6, NO. 1, JANUARY 2016, pp. 286-294, provides an extensive and informative discussion of issues related to possible configuration and operation of such an arrangement by recognizing, for instance, that better results in terms of localization of faults and estimation of yield degradation can be reached by adopting real-time "high granularity" approaches relying on sensors applied to individual PV panels 10, for instance with accurate power loss mapping obtained by equipping the panels with individual DC power optimizers, with energy loss estimated by comparing each panel with the best performing one in the plant under the assumption that the optimizer always reaches the maximum power point. The captioned article also discusses other high-granularity solutions based on monitoring circuits (or "sensors") mounted on selected host panels for the real-time detection of their operating points, the possibility of performing measurements of various other parameters such as of the open-circuit voltage Voc, the short-circuit current Isc, the operating voltage Vpanel and current Ipanel of the monitored panel, as well as the possibility of providing a wireless PV sensor to facilitate remote performance monitoring while also permitting each individual panel to be disconnected or bypassed with respect to the string.

The captioned article recognizes that in various prior art solutions, no information can be gained about the power which might potentially be produced and the "health" status of the panel and that in order to obtain a complete characterization unaffected by the inverter action, various sensors may keep the panel in disconnection mode in order to measure Voc and Isc.

It was observed that none of the micro-inverter, the optimizer or the wireless sensor as discussed in the P. Guerriero et al. article (already cited) is in a position to rely on the solar panel I-V (current-voltage) characteristic curve, which gives a detailed description of its solar energy conversion ability and efficiency.

Figure 2:
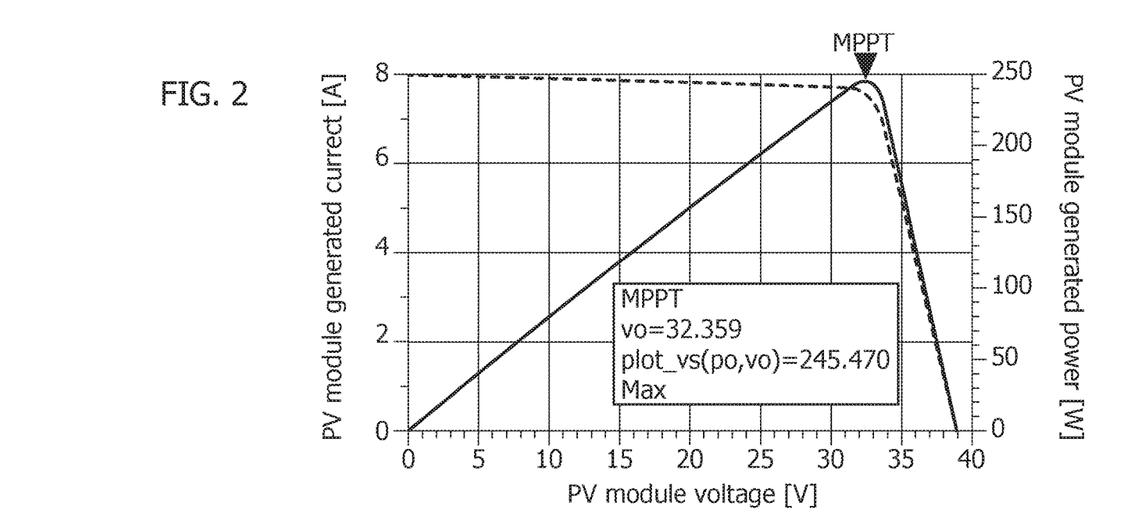
FIG. 2 is a diagram showing a possible characteristics curve of the current and power generated by a photovoltaic module.

A diagram exemplary of such a curve is reproduced in FIG. 2, where a current generated by a PV module (dashed line—ordinate scale left—Ampère units) is shown against a corresponding PV module voltage (abscissa scale—Volt units). The same diagram also shows the corresponding generated power (continuous line—ordinate scale right—Watt units).

FIG. 2 shows that the I-V characteristic (briefly, I-V curve) exhibits a steady increase for increasing module voltages on the left side of the peak value followed by a steep drop as the module voltage is increased beyond the peak value on the right side of the peak value.

Other parameters/operation condition being unchanged, the I-V characteristic exhibits a peak ($P_{max}$) which should desirably correspond to a maximum solar generated power point (MPPT). In order to increase the electrical power generated by a string of photovoltaic generators a control device 12 as discussed previously (be it an inverter, a micro-inverter or an optimizer) may essentially aim at biasing the PV panels or module 10 around a value $P_{mppt}$ corresponding to the point MPPT illustrated in FIG. 2.

Figure 3:
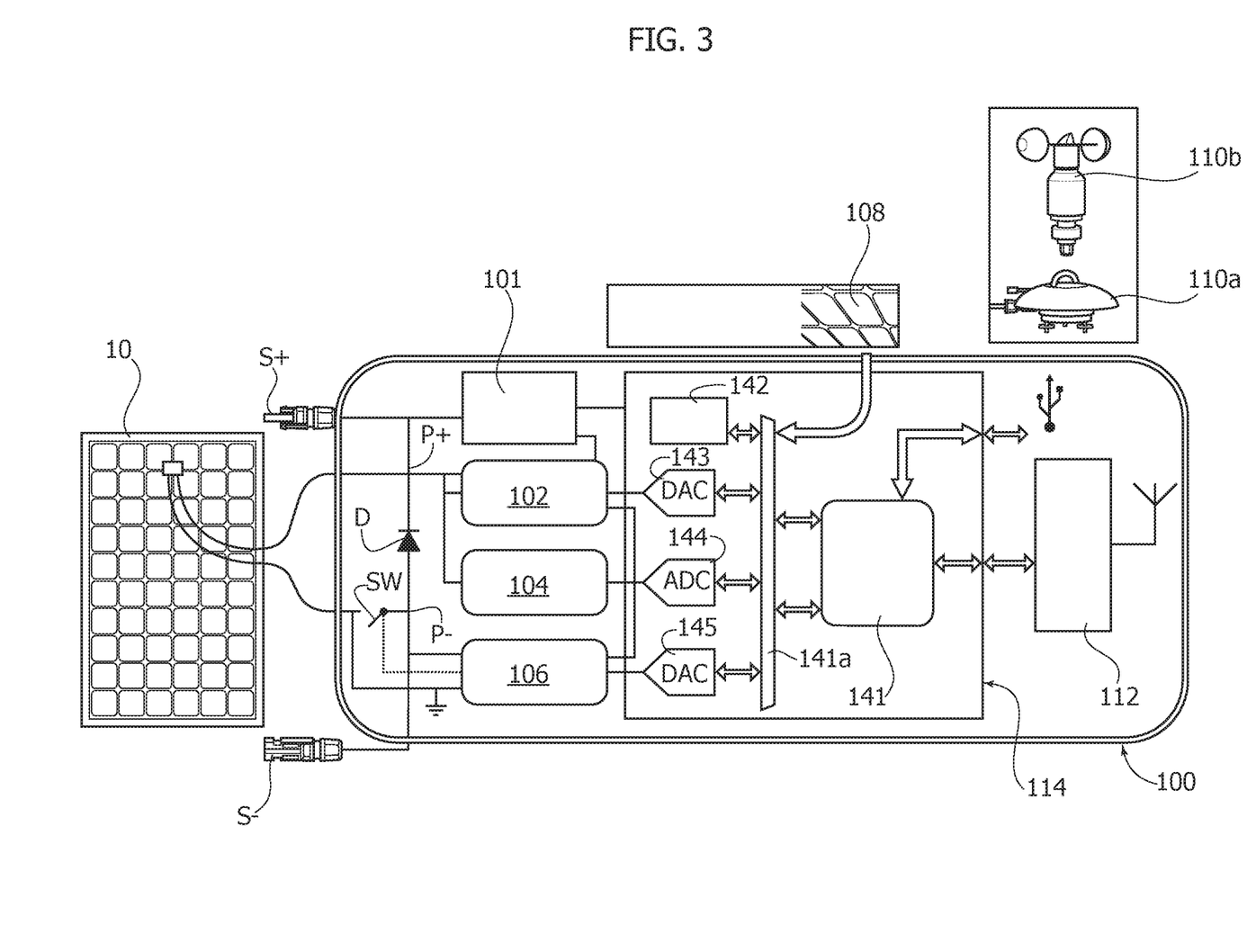
FIG. 3 is an exemplary block diagram of a sensor for use with a photovoltaic panel.

One or more embodiments may provide for coupling with a plurality of PV panels/modules (that is PV generators) 10 in a PV power plant respective electronic "sensor" devices 100 which, in one or more embodiments, may have the architecture exemplified in FIG. 3.

Figure 5:
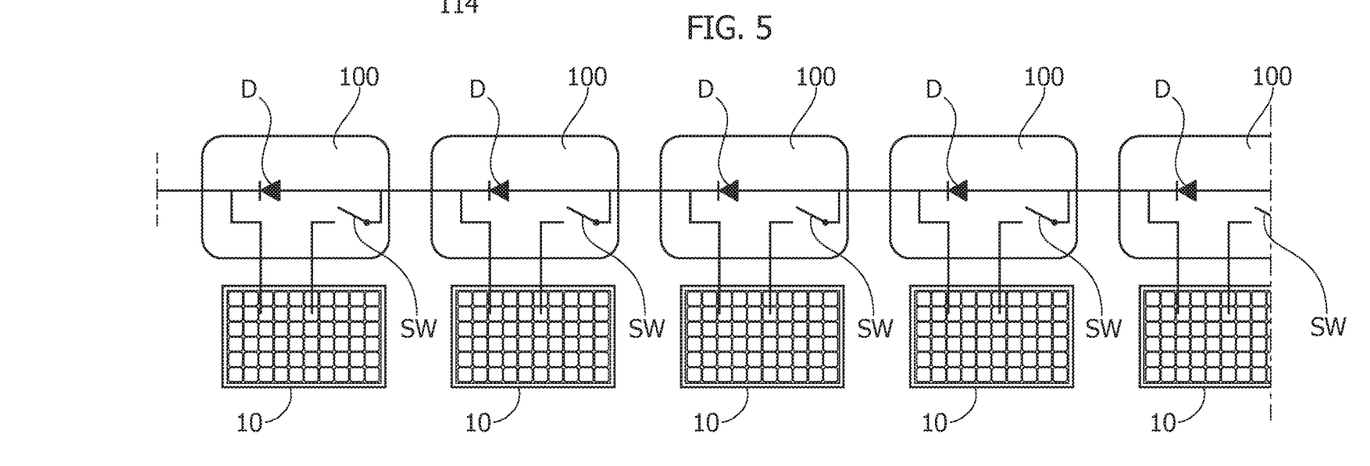
FIG. 5 is exemplary of a possible layout of a photovoltaic generation system according to embodiments.

In one or more embodiments, a device 100 may include electrical connectors S+, S− which facilitate "physically" connecting the device 100 as associated to a panel 10 in a string-like arrangement as depicted in FIG. 1 (and FIG. 5).

In one or more embodiments, as exemplified in FIG. 3, the device 100 may include a DC/DC supply stage 101 devised to generate voltage levels. These may include, e.g., 3.3 V for a controller unit 114 (e.g., a MicroController Unit—MCU) and 12 V for an I-V curve measuring circuit 102 (and other circuits in the device 100) as discussed in the following.

In one or more embodiments the MCU 114 may include a MCU processing unit 141 and an associated bus 141a. A microcontroller of the STM 32 family available with the companies of the ST group is exemplary of such a microcontroller.

In one or more embodiments, the supply stage 101 may be realized with an integrated dc-dc step-up converter adapted to be fed from the S+ connector, possibly with the capability of operating as an energy harvester from an associated panel 10 and/or a back-up energy storage element, thus facilitating maintaining sensor operation (e.g., wireless networking as discussed in the following) for some time after the occurrence of severe non-functioning conditions.

In one or more embodiments, the device 100 as exemplified in FIG. 3 includes the I-V curve measuring or detection circuit 102 as better detailed in the following in connection with FIG. 4.

In one or more embodiments, the device 100 as exemplified in FIG. 3 includes a measuring circuit 104 as well as a bypass control circuit 106, controlling a switch SW.

In one or more embodiments as exemplified in FIG. 3 the switch SW is intended to operate in conjunction with a diode D acting between two points P+, P− in such a way that, depending on the switch position, the associated panel 10 (PV generator) may be either coupled, for instance series-connected, with the other panels 10 in the plant or bypassed, to thereby merely act (via the diode D) as a pass-through node for the string current generated by the other panels in the plant (see, e.g., FIGS. 1 and 5 for immediate reference).

In one or more embodiments, the bypass control circuit 106 may in turn operate under the supervision of the (micro)controller 114.

In one or more embodiments, the controller 114 may be configured (for instance, programmed) in such a way that the controller may at certain times (e.g., at certain repeated intervals or on demand) de-couple from the string shown in FIG. 1 the PV panel 10 to which a device (sensor) 100 is associated, thus facilitating performing the I-V curve detection procedure discussed in the following in connection with FIG. 4.

In one or more embodiments, the controller 114 may be sensitive (e.g., via a standard USB interface) to one or more signals indicative of the operation conditions of the panel 10

(PV generator). In one or more embodiments, these signals may include "environment" signals from, e.g., an external pyranometer 110*a* sensing the solar irradiance level and/or an anemometer 110*b* sensing wind speed.

In one or more embodiments, the controller 114 may integrate, for instance coupled to the bus 141*a*, a temperature sensor 142 sensing ambient temperature.

Other sensors such as, for instance, a sensor 108 sensing the PV panel operating temperature may be provided, e.g., coupled with the bus 141*a*.

In one or more embodiments, the processing unit 141 may communicate, for instance via the bus 141*a*, with a bank of analog/digital converters 143, 144, 145.

In one or more embodiments conversion can be:

from the digital domain of the processing unit 141 and bus 141*a* to the analog domain of the I-V curve measuring circuit 102 and the bypass circuit 106 as exemplified at 143 and 145, and from the analog domain of the I-V curve measuring circuit 102, the measuring circuit 104 and the bypass circuit 106 to the digital domain of the bus 141*a* and the processing unit 141 as exemplified at 144.

In one or more embodiments, the unit 141 may collect various signals received, e.g., from sensors as introduced previously and possibly act (e.g., via the bypass circuit 106) so that a certain PV panel is bypassed or possibly disconnected e.g., in emergency cases (as for example fire as detected via the sensors 108 and/or 142).

In one or more embodiments, a damaged, dirty or "shadowed" PV panel can be bypassed/disconnected automatically by the bypass circuit 106, without supervision from the controller 114, which is merely informed of such status change of the PV panel.

In one or more embodiments, the measuring circuit 104 can perform (in a manner known per se) measurements of the operating voltage Vpanel and operating current Ipanel, the open-circuit voltage Voc, the short-circuit current Isc, of the monitored panel 10 (PV generator) by disconnecting it (e.g., via the switch SW, which may include an electronic switch) from the string.

In one or more embodiments, a communication circuit 112 (for instance of the wireless type) may be coupled with the controller 114 so that information on the status (e.g., normal/bypassed/disconnected) and/or the operating conditions of the PV panel 10 and/or the device 100 may be transmitted to a (remote) supervisor entity of the plant. A (manned or unmanned) control station, e.g., associated with the control unit (inverter) 12 of FIG. 1 may be exemplary of such supervisory entity.

One or more embodiments may thus expand the gamut of possible operation strategies for the controller 114 over those presented in the article by Guerriero et al. cited previously.

To that effect, one or more embodiments may include the I-V curve measuring circuit 102, which is suited for sensing the real-time "on-field" I-V characteristic of an individual panel (PV generator) 10.

Reference to an on-field characteristic is intended to highlight the possibility for a sensor device 100 to monitor the I-V characteristic curve of the associated PV panel 10 (PV generator) without "physically" disconnecting it from the PV string.

In one or more embodiments, the individual PV generator (panel) 10 can become a "smart" entity capable of providing, in addition or as an alternative to other information, a warning/alert signal indicative of unsatisfactory functionality (e.g., $P_{max}$ lower than an expected guaranteed value) determined as a result of the I-V curve detection procedure discussed in the following in connection with FIG. 4.

In one or more embodiments, the communication circuit 112 may transmit to a supervisor entity information as to the functionality of the generator 10 (PV panel or module) as obtained as a result of the I-V curve detection procedure discussed in the following in connection with FIG. 4.

In one or more embodiments, the PV I-V characteristic curve may be correlated with other parameters such as, e.g., ambient, panel temperature, wind velocity, sun irradiance intensity as discussed previously.

In one or more embodiments, such correlation may be based on the observation that operation of a device 100 as discussed previously may be based on:

possible (e.g., real-time) measurement of the peak (maximum) electric power actually generated by an individual PV generator ($P_{max}$), e.g., at certain solar irradiance level on a panel surface and at a certain ambient and panel temperature (that feature being desirable also for product warranty purposes), operation of the PV generator (as controlled, e.g., via an inverter based on principles known per se, as discussed previously) including (real-time) verification of the correct tracking of maximum power $P_{mppt}$ expected to be generated by a PV panel.

One or more embodiments may permit to check (e.g., on a periodical basis or on demand) adequate functionality of a PV generator (such as any of the PV panels 10 included in a photovoltaic power plant) by exploring the I-V curve and checking if its peak, $P_{max}$ lies in the vicinity of (and notionally coincides with) $P_{mppt}$.

A related procedure can be triggered (on a periodic basis or on demand), e.g., by the controller 114 to activate a sort of self-test procedure of a PV generator 10 with the aim of checking whether the functionality thereof (for instance the value $P_{max}$) is in line with expected performance (for instance $P_{mppt}$) by taking into account actual operating parameters/conditions such as, e.g., solar irradiance on the panel surface and ambient and panel temperature.

Irrespective of how the I-V curve is eventually exploited, one or more embodiments may provide a simple architecture for the I-V curve measuring circuit 102 which, while facilitating sensing the I-V curve of a PV generator such as a PV panel, may permit to integrate a sensor device 100 (directly) within a PV panel junction box, either during the fabrication phase or in a PV panel already installed.

Figure 4:
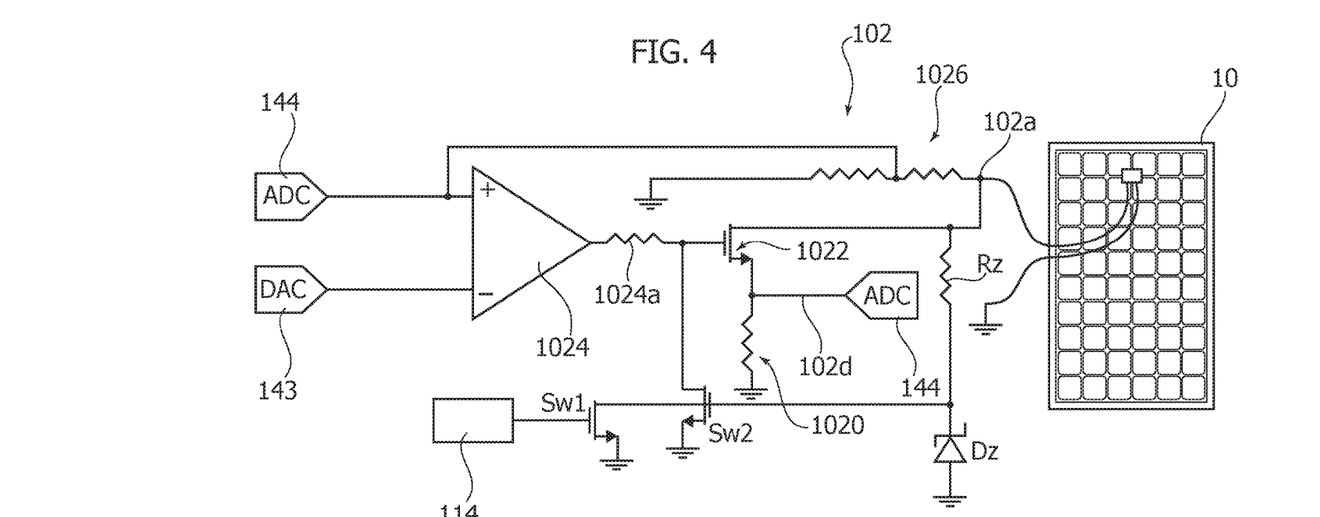
FIG. 4 is exemplary of a circuit which may be included in an implementation of a block in FIG. 3.

In one or more embodiments as exemplified in FIG. 4, the I-V curve measuring circuit 102 includes a first terminal (contact) 102*a* to be coupled with an associated PV generator (panel or module) 10, e.g., at the point P+ in FIG. 3.

In order to trace the PV panel I-V characteristic curve, the I-V curve measuring circuit 102 in FIG. 4 acts as a sensing circuit which may be activated once the associated PV generator (panel or module) 10 is decoupled (electrically, e.g., via the switch SW in FIG. 3) from the associated generator string—see FIGS. 1 and 5.

It will be appreciated that this will not require "physical" disconnection, e.g., at the connectors S+ and S− in FIG. 3.

In one or more embodiments as exemplified in FIG. 4, the I-V curve measuring circuit 102 implements a negative feedback loop, where the digital-to-analog converter (DAC) 143—which may be controlled by the processing unit 141—is used to set (scan) a voltage across the PV panel terminal 102*a* (abscissa in the I-V curve of FIG. 2).

The analog-to-digital converter (ADC) 144 may be coupled to an amperometric sensor, such as a sensing resistor 1020, in the current path (e.g., at the source terminal)

of a power transistor 1022 (such as a channel-n MOSFET), in order to read the corresponding PV panel solar generated current (ordinate in the I-V curve of FIG. 2).

A (high-gain) differential stage operational amplifier 1024 is coupled to the ADC 144 and the DAC 143. The operational amplifier 1024 drives, e.g., via a resistor 1024a, a control terminal (gate) of the transistor 1022.

In the exemplary circuit of FIG. 4, the digital-to-analog converter 143—as used to scan a voltage across the PV panel terminal—is coupled to the inverting input of the differential stage operational amplifier 1024 while the analog-to-digital converter (ADC) 144 senses (also) the signal at the non-inverting input of the differential stage 1024.

The converter 144 (this may be a two-channel converter providing analog-to-digital conversion of both signals sensed at the amperometric resistor 1020 and at the non-inverting input of the differential stage 1024) may thus check if the PV panel voltage, sensed, e.g., as a scaled-down replica provided by a (high impedance) voltage divider 1026 coupled to the terminal 102a, has been correctly set by the power transistor 1022 driven by the (high gain) differential stage 1024 in order to null the differential error voltage between its positive and negative input terminals.

A circuit including two switches Sw1, Sw2 (e.g., two electronic switches such as nMOSFETs), a Zener diode Dz and an associated biasing resistor Rz can implement an enabling/disabling function of the I-V curve detection procedure just discussed.

More in detail, in the exemplary circuit of FIG. 4, the controller 114 is coupled to the control terminal (gate) of the switch (nMOSFET transistor) Sw1 having its source to ground and its drain coupled to the control terminal (gate) of the switch (nMOSFET transistor) Sw2, whose current path (source-drain) is set between the control terminal (gate) of the power transistor 1022 and ground. The resistor Rz is set between the terminal 102a and the cathode of the Zener diode Dz, which is coupled to the control terminal (gate) of the switch (nMOSFET transistor) Sw2, with the anode of the Zener diode Dz to ground.

During normal operation of the PV string, the voltage across the Zener diode Dz activates (turns-on) the switch Sw2, which, by de-activating (switching-off) the power transistor 1022, disables the I-V curve tracing functionality.

In order to enable the I-V characteristic measurement phase, the controller 114 can activate (switch-on) the transistor Sw1, which enables the I-V tracing feedback loop by de-activating (turning-off) the switch Sw2.

In one or more embodiments as exemplified in FIG. 4, the controller 114 may thus be programmed, in a manner known per se, to detect the peak of the I-V curve corresponding to $P_{max}$. For instance the processing unit 141 can compute the products of the pairs of corresponding voltage and current values collected by the controller 114 via the ADC converter(s) 144 while "scanning" the I-V curve and detecting the highest value as the one after which increasing voltage values result in a drop in the power value computed.

Such peak value (e.g., $P_{max}$) may then be correlated (in various ways) with other parameters as discussed previously.

Just to make a simple example for ease of understanding, the value $P_{max}$ can be compared (e.g., in the processing unit 141) against an expected (e.g., average) value stored therein indicative of the solar power for each PV panel as tracked by the control device 12, e.g., under certain conditions in terms of, say, solar irradiance level, ambient and/or panel temperature. In the presence of a value for $P_{max}$ found to be deviating (e.g., in excess of an certain acceptance threshold) from an expected value, such as $P_{mppt}$, the panel can be set to a faulty state (e.g., labelled to be "defective") with a corresponding warning/alert sent (e.g., with communication circuit 112) to the supervisory entity with the panel possibly "removed" from the string (in a known manner). The acceptance threshold may be selected to be any suitable value, which may depend on a desired sensitivity of the panels to deviations from the expected values.

The block diagram of FIG. 5 (where parts or elements corresponding to parts or elements already discussed in connection with other figures are indicated with like references, thus making it unnecessary to repeat a corresponding description) is exemplary of an electronic circuit topology which implements the I-V characteristic measurement for a plurality of PV generators (panels) 10 including respective sensor device 100 as per the block diagram of FIG. 3.

In one or more embodiments, a method may include:

providing a plurality of photovoltaic generators (e.g., 10), the photovoltaic generators in the plurality of photovoltaic generators cooperative in producing photovoltaic power, coupling with the photovoltaic generators in the plurality of photovoltaic generators respective sensor devices (e.g., 100), the sensor devices including sensor circuits (e.g., 102) of the individual current-to-voltage characteristics of the photovoltaic generators in the plurality of photovoltaic generators, activating (see, e.g., 114, Sw1, Sw2 in FIG. 4) the sensor circuits in the sensor devices and sensing (e.g., 144) the individual current-to-voltage characteristics of the photovoltaic generators in the plurality of photovoltaic generators, wherein the individual current-to-voltage characteristics are indicative of the functionality of the photovoltaic generators in the plurality of photovoltaic generators.

One or more embodiments may include calculating (e.g., at 141) a peak value, $P_{max}$, of said individual current-to-voltage characteristics.

One or more embodiments may include producing (e.g., 141, 112), as a function of the individual current-to-voltage characteristics of the photovoltaic generators sensed by activating the sensor circuits in the sensor devices coupled with the photovoltaic generators, information signals (e.g., 112) indicative of the functionality of the photovoltaic generators in the plurality of photovoltaic generators.

One or more embodiments may include transmitting (e.g., at 112) to a supervisor entity (e.g., 12) of the plurality of photovoltaic generators (10) said information signals indicative of the functionality of the photovoltaic generators.

It will be appreciated that producing/transmitting such information signals does not necessarily imply setting the generator to a defective status and/or decoupling the defective photovoltaic generator from the string of photovoltaic generators.

One or more embodiments may include:

processing (e.g., at 141) the individual current-to-voltage characteristic of a photovoltaic generator in the plurality of photovoltaic generators to produce a value (e.g., $P_{max}$) indicative of the individual photovoltaic power generated by said photovoltaic generator in the plurality of photovoltaic generators the photovoltaic generators, comparing the value produced with a reference value (e.g., $P_{mppt}$), and if the value produced is found to deviate in excess of an acceptance threshold with respect to the reference value, setting to a defective status said photovoltaic generator in the plurality of photovoltaic generators.

One or more embodiments may include disabling (e.g., SW in FIG. 3) cooperation of a photovoltaic generator in the plurality of photovoltaic generators in producing photovoltaic power with the other photovoltaic generators in the plurality of photovoltaic generators while activating the sensor circuit in the sensor device coupled with said photovoltaic generator and sensing the individual current-to-voltage characteristic of said photovoltaic generator.

A circuit according to one or more embodiments may include:

a sensing terminal (e.g., 102a) couplable to a photovoltaic generator, a source (e.g., 143) of a voltage scanning signal, a differential stage (e.g., 1024) having first and second non-inverting and inverting inputs coupled (e.g., at 1026 for 102a) to said sensing terminal and to the source of voltage scanning signal (i.e. DAC 143), a transistor (e.g., 1022) having a current path (e.g., source-drain, in the case of a field effect transistor such as a MOSFET) and a control terminal (e.g., gate, in the case of a field effect transistor such as a MOSFET) controlling current flow in said current path, the current path and the control terminal of the transistor coupled to said sensing terminal and to the output of the differential stage, respectively an amperometric sensor (e.g., 1020) active on the current path of the transistor, first and second sensing members (e.g., a two-channel ADC 144), the first sensing member active between the sensing terminal and the differential stage and the second sensing member active on the amperometric sensor.

In that way, with the source (e.g., the DAC 143) of voltage scanning signal activated, the sensing members (e.g., the ADC 144) are sensitive to corresponding voltage and current value pairs in the current-to-voltage characteristic of a photovoltaic generator coupled to said sensing terminal.

In one or more embodiments:

the source of voltage scanning signal may include a digital-to-analog converter, the first and second sensing members may include at least one analog-to-digital converter.

One or more embodiments may include switching circuitry (e.g., Sw1, Sw2, Dz, Rz in FIG. 4) coupled with said transistor, the transistor selectively activatable and de-activatable by the switching circuitry.

In one or more embodiments a sensor device (e.g., 100) may include a circuit according to one or more embodiments, the sensor device optionally including a connector set (S+, S−) configured for coupling the sensing terminal in said circuit to a photovoltaic generator.

In one or more embodiments, a photovoltaic generator may be equipped (natively or by way of retrofitting) with a sensor device according to one or more embodiments.

In one or more embodiments, a photovoltaic power generation system may include a plurality of photovoltaic generators cooperative in producing photovoltaic power, the photovoltaic generators in the plurality of photovoltaic generators including photovoltaic generators (10) according to one or more embodiments, wherein the system is operable with the method of one or more embodiments.

Without prejudice to the underlying principles, the details and embodiments may vary, even significantly, with respect to what has been disclosed by way of example only, without departing from the extent of protection.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, including:
coupling a plurality of sensor devices to respective ones of a plurality of photovoltaic generators that cooperatively produce photovoltaic power, each sensor device including a current-to-voltage measuring circuit including:
a sensing terminal coupled to the photovoltaic generator;
a source terminal coupled to a source of a voltage scanning signal;
a differential stage having a non-inverting input coupled to the sensing terminal and an inverting input coupled to the source terminal;
a transistor having a control terminal and first and second conduction terminals, the control terminal coupled to an output of the differential stage, the first conduction terminal coupled to the sensing terminal; and
an amperometric sensor coupled to the second conduction terminal of the transistor; and
sensing current-to-voltage characteristics of the photovoltaic generators with the respective current-to-voltage measuring circuits.

2. The method of claim 1, including calculating a peak value of the current-to-voltage characteristics.

3. The method of claim 1, including producing, as a function of the current-to-voltage characteristics of the photovoltaic generators information signals indicative of a functionality of the photovoltaic generators.

4. The method of claim 3, including transmitting to a supervisor entity of the plurality of photovoltaic generators said information signals indicative of the functionality of the photovoltaic generators.

5. The method of claim 1, including:
generating a value indicative of a photovoltaic power of one of the photovoltaic generators by processing the current-to-voltage characteristic of the photovoltaic generator;
comparing the value with a reference value; and
outputting a defective status signal in response to the value exceeding a threshold range from the reference value.

6. The method of claim 1, including disabling one of the photovoltaic generators of the plurality of photovoltaic generators from producing photovoltaic power cooperatively with the other photovoltaic generators of the plurality of photovoltaic generators while activating the current-to-voltage measuring circuit in the sensor device coupled to the disabled photovoltaic generators and sensing the current-to-voltage characteristic of the disabled photovoltaic generator.

7. A circuit, including:
a sensing terminal couplable to a photovoltaic generator;
a source terminal configured to receive a voltage scanning signal;

a differential stage having a non-inverting input coupled to said sensing terminal and an inverting input coupled to the source terminal;

a transistor having a control terminal and first and second conduction terminals, the control terminal coupled to an output of the differential stage, the first conduction terminal coupled to the sensing terminal;

an amperometric sensor coupled to the second conduction terminal of the transistor; and first and second sensing members, the first sensing member coupled to the sensing terminal and the non-inverting input of the differential stage and the second sensing member coupled to the amperometric sensor.

8. The circuit of claim 7, wherein:

the source terminal is configured to receive the voltage scanning signal via a digital-to-analog converter; and the first and second sensing members include at least one analog-to-digital converter.

9. The circuit of claim 7, including switching circuitry coupled to said transistor, the transistor being selectively activatable and de-activatable by the switching circuitry.

10. The circuit of claim 7 wherein the first and second sensing members are respective channels of a two-channel analog-to-digital converter.

11. A sensor device, comprising:

an I-V characteristic measuring circuit configured to measure a real-time I-V characteristic of a photovoltaic generator, the I-V characteristic measuring circuit including:

a sensing terminal couplable to the photovoltaic generator;

a source terminal configured to receive a voltage scanning signal;

a differential stage having a non-inverting input coupled to said sensing terminal and an inverting input coupled to the source terminal;

a transistor having a control terminal and first and second conduction terminals, the control terminal coupled to an output of the differential stage, the first conduction terminal coupled to the sensing terminal; and an amperometric sensor coupled to the second conduction terminal of the transistor; and a controller, including:

first and second sensing members, the first sensing member coupled to the sensing terminal and the non-inverting input of the differential stage and the second sensing member coupled to the amperometric sensor.

12. The sensor device of claim 11, the device including a connector set configured to couple the sensing terminal to the photovoltaic generator.

13. The sensor device of claim 11 wherein the controller further includes a temperature sensor configured to sense a temperature of the photovoltaic generator.

14. The sensor device of claim 11 wherein the I-V characteristic measuring circuit further includes switching circuitry coupled to the transistor, the controller being configured to control the switching circuitry to selectively activate and de-activate the transistor.

15. The sensor device of claim 11 wherein the controller is configured to determine a functional state of the photovoltaic generator based on the measured I-V characteristic.

16. The sensor device of claim 15 wherein the controller further includes wireless communication circuitry configured to transmit information indicative of the determined functional state of the photovoltaic generator.

17. A photovoltaic generator equipped with the sensor device according to claim 11.

18. A photovoltaic power generation system, comprising:

a plurality of photovoltaic generators electrically coupled to one another and configured to cooperatively generate photovoltaic power;

a plurality of sensor devices, each of the sensor devices being coupled to respective ones of the plurality of photovoltaic generators, each of the sensor devices having a sensor circuit that includes:

a sensing terminal couplable to the respective one of the photovoltaic generators;

a source terminal configured to receive a voltage scanning signal;

a differential stage having a non-inverting input coupled to said sensing terminal and an inverting input coupled to the source terminal;

a transistor having a control terminal and first and second conduction terminals, the control terminal coupled to an output of the differential stage, the first conduction terminal coupled to the sensing terminal;

an amperometric sensor coupled to the second conduction terminal of the transistor; and first and second sensing members, the first sensing member coupled to the sensing terminal and the non-inverting input of the differential stage and the second sensing member coupled to the amperometric sensor.

19. The photovoltaic power generation system of claim 18 wherein each of the sensor devices further includes a connector set configured to couple the sensing terminal to the respective one of the photovoltaic generators.

20. The photovoltaic power generation system of claim 18 wherein each of the sensor devices further includes a controller coupled to the transistor and configured to selectively activate and de-activate the transistor.

* * * * *